United States Patent
Lopez et al.

(10) Patent No.: US 6,833,503 B2
(45) Date of Patent: Dec. 21, 2004

(54) DEVICE FOR FIXING DISTRIBUTION BOXES

(75) Inventors: Ramon Pinana Lopez, Valls (ES); Ferran Juanes, Valls (ES)

(73) Assignee: Lear Automotive (EEDS) Spain, S.L. (ES)

( * ) Notice: Subject to any disclaimer, the term of this patent is extended or adjusted under 35 U.S.C. 154(b) by 0 days.

(21) Appl. No.: 10/415,746

(22) PCT Filed: Nov. 3, 2001

(86) PCT No.: PCT/ES01/00419

§ 371 (c)(1),
(2), (4) Date: Nov. 3, 2003

(87) PCT Pub. No.: WO02/37916

PCT Pub. Date: May 10, 2002

(65) Prior Publication Data

US 2004/0069520 A1 Apr. 15, 2004

(51) Int. Cl.[7] .................................................. H02G 3/08

(52) U.S. Cl. ............................ 174/50; 174/53; 174/57; 439/76.2; 220/3.2

(58) Field of Search ..................... 174/50, 17 R, 174/53, 57, 54, 61, 58, 66; 439/76.1, 949, 76.2, 467; 220/3.2, 3.8, 4.02; 361/600, 641, 679

(56) References Cited

U.S. PATENT DOCUMENTS

| | | | | |
|---|---|---|---|---|
| 5,515,988 A | * | 5/1996 | Oda ............................. | 220/3.8 |
| 5,777,843 A | * | 7/1998 | Younce ....................... | 361/641 |
| 5,837,938 A | * | 11/1998 | Sakamoto .................... | 174/66 |
| 5,868,583 A | * | 2/1999 | Naitou et al. .............. | 439/76.2 |
| 5,915,978 A | * | 6/1999 | Hayakawa et al. ......... | 439/76.2 |
| 6,176,735 B1 | * | 1/2001 | Kawaguchi .................. | 439/467 |
| 6,196,882 B1 | * | 3/2001 | Sato et al. ................... | 174/50 |
| 6,561,822 B2 | * | 5/2003 | Depp et al. ................. | 439/76.2 |
| 6,570,088 B1 | * | 5/2003 | Depp et al. .................. | 174/50 |
| 6,659,792 B2 | * | 12/2003 | Saka et al. ................... | 174/59 |

FOREIGN PATENT DOCUMENTS

| | | |
|---|---|---|
| DE | 3602446 | 7/1987 |
| EP | 923176 | 6/1999 |
| ES | 2072782 T | 7/1995 |
| JP | 11001134 | 1/1999 |

* cited by examiner

*Primary Examiner*—Dean A. Reichard
*Assistant Examiner*—Angel R. Estrada
(74) *Attorney, Agent, or Firm*—Nixon Peabody LLP; Jeffrey L. Costellia

(57) ABSTRACT

An improved distribution box fixing device located on the distribution boxes intended to house a vehicle's electric and electronic distribution system, and being temporarily fixed to a support, so that said device has a U-shaped pin on the front part of the box, joined to it by one of its ends and the other end being free and fitted into a hole on the support made for this purpose.

5 Claims, 2 Drawing Sheets

DEVICE FOR FIXING DISTRIBUTION BOXES

OBJECT OF THE INVENTION

As indicated in its title, the present invention consists of an improved distribution box fixing device permitting the distribution box to be simply and quickly fixed to the body of an automobile. The new construction, conformation and design features comply with the objective for which it has specifically been designed with maximum security and efficiency.

STATE OF THE ART

In the state of the art, there are multiple distribution box fixing and anchoring systems to vehicle bodies. It is a field of the art in which small improvements are continuously being introduced for the purpose of achieving greater security, further simplifying the devices to use.

In patent ES-9901810, a distribution box fixing system for the vehicle is disclosed, consisting of a U-shaped support piece fixed on the vehicle. The distribution box is housed inside of said separation part, and the side walls of the support piece are provided with a series of housings adapted to receive a plurality of side protrusions complementary of the distribution box.

The feature of the mentioned distribution box fixing system lies in the lack of screws securing its position on the vehicle. In spite of seeming to be an advantage, this could result in the box detaching from its support on the vehicle with the subsequent damage for the vehicle's electric system. The conventional distribution boxes are fixed to the vehicles by means of screws, which requires too much assembly and disassembly time.

DESCRIPTION

The present distribution box fixing and anchoring device is mainly based on introducing a pin that will be housed in a bell-mouthed hole, the pin fitting in and providing greater security to the fixing system. This system will also have an additional fixing element as a result of placing a retainer and lock screw preventing the pin from coming out.

This improved fixing system permits box assembly directly on the body plate or on an additional support and through the holes provided on the body or additional support.

In the case of assembly on the body plate, the plate should be provided with bell-mouthed, half-figured holes for housing hooks arranged on the box's lower part. Once these first hooks are housed, the pin on the box's front part will be introduced with a rotational movement into another completely bell-mouthed hole, that is to say with the shape of a trumpet mouth, located on the body until reaching the butts the box has in the area of the hooks.

The box is centered as a result of introducing butts with an inclined plane into holes arranged on the box for this purpose, having a folded end that centers the box on the body or plate upon facing the butts with the inclined plane.

Lastly, and once the pin has entered the corresponding hole, a retainer arranged for this purpose will drop down, preventing the pin from returning, finally placing a lock screw.

If assembled on an additional support and not directly on the body, the system would be very similar and in this case should have vertical holes permitting the introduction of the pivots located on the lower part of the box and the rotational movement for the introduction of the pin, thus centering the box.

The rotational movement is performed as in the previous case and in the same way as before, permits the pin to be introduced into a bell-mouthed hole on the support when the distribution box butts make contact with the support, thus locking the pin.

Like before, a retainer is used to secure this position which when lowered, fixes the pin and a screw is also placed.

DESCRIPTION OF THE DRAWINGS

To facilitate the understanding of the improved distribution box fixing device, three drawings are attached to the present patent application for the purpose of better understanding the fundamentals on which the invention concerning us is based and the better understanding of a preferred embodiment of the invention, keeping in mind that the character of the drawings is illustrative and non-limiting.

PREFERRED EMBODIMENT OF THE INVENTION

Figure 1:
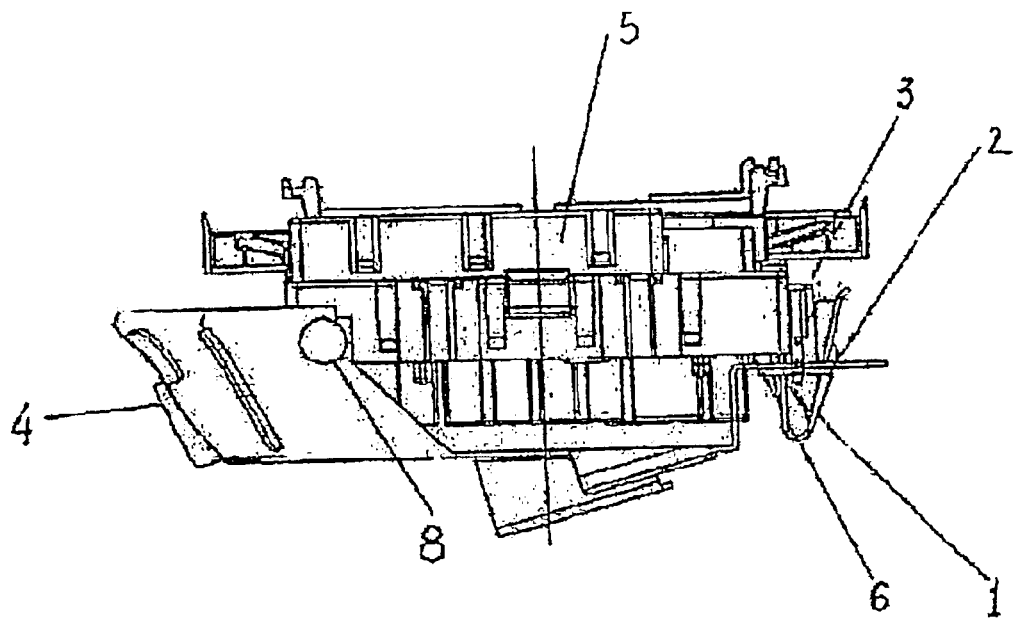
FIG. 1 shows a side view of the distribution box introduced in the support.
Figure 2:
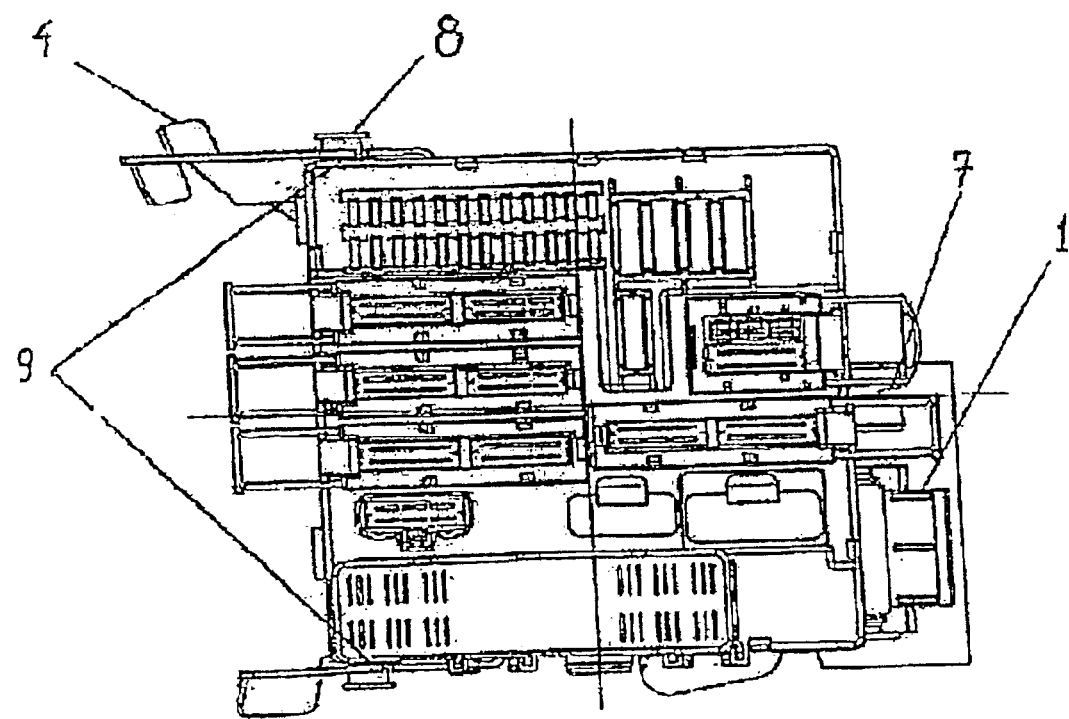
FIG. 2 shows a plan view of the distribution box introduced in the support.
Figure 3:
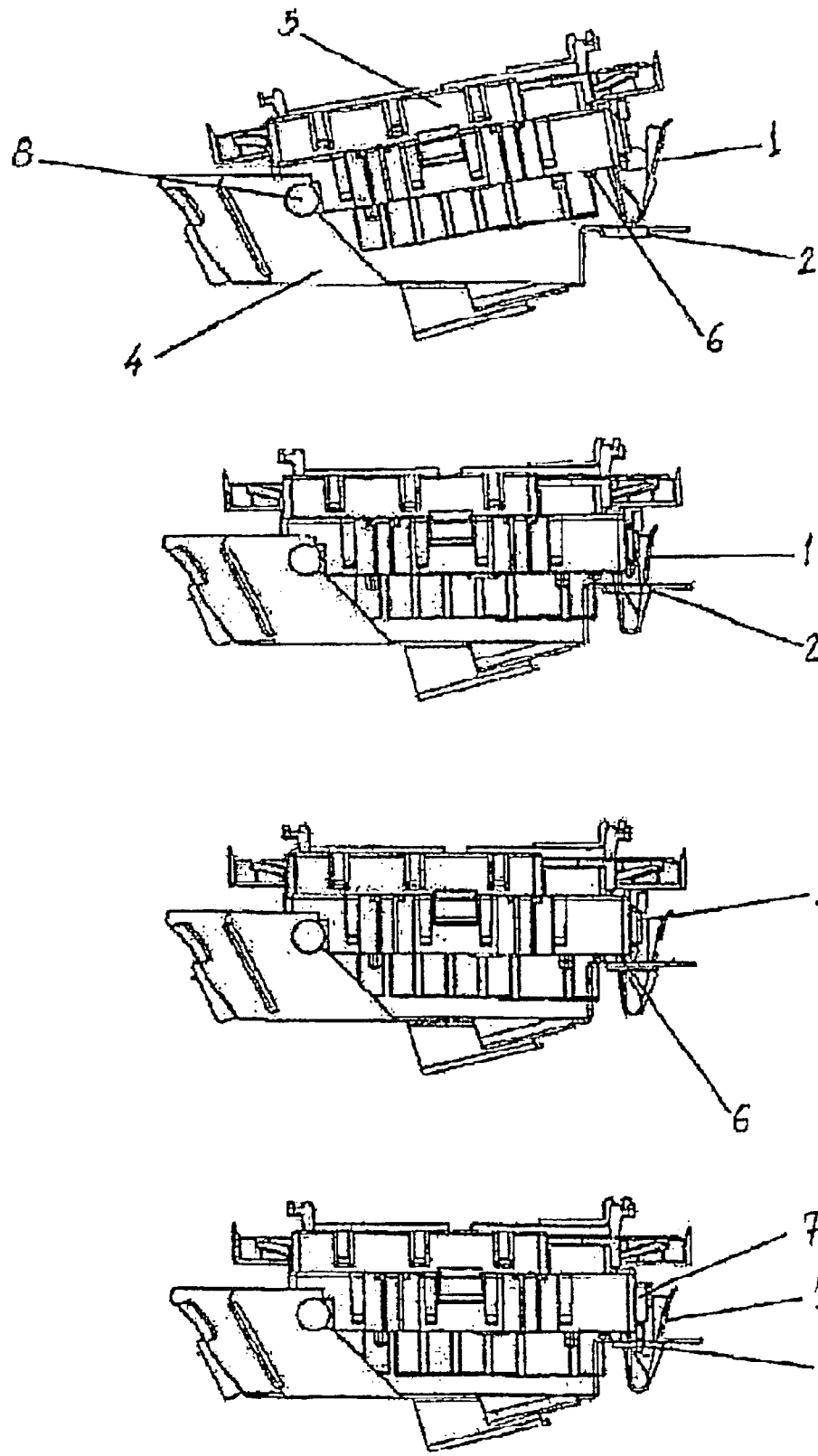
FIG. 3 shows the assembly process of the distribution box in the support.

The assembly of the distribution box on the vehicle body or on a piece installed on the body to house the distribution box is fast and easy as will now be detailed.

To assemble the distribution box 5 on the additional support 4, pivots 8 arranged on two opposite sides of the distribution box 5 and next to its back part are introduced in two bell-mouthed holes 9 arranged for this purpose on the support 4. These pivots 8 facilitate correct location and centering of the distribution box 5 on the support 4. Once the pivots 8 are introduced, they rotate on the inside of the half-figured holes 9 on the support 4.

The box rotates until the U-shaped pin 1, connected to the box 5 on one of its ends, the other end being free and arranged on the first and front side of the box 5, is introduced into a bell-mouthed hole 2 on the support 4, designed to house said pin 1. The pin 1 will be in its position when the butts 6 arranged on the lower part of the box have made contact with the support 4, preventing the continuation of the rotational movement of the box 5 on the support 4. As shown in the drawings, the pin has a protrusion, fitting in the bell-mouthed hole 2, preventing the pin 1 from coming out of the hole 2 unless said pin 1 protrusion is pushed inward.

Once said pin 1 is introduced into the hole 2, a retainer 3 slips downward, assuring the pin's 1 position in the hole and its possible return due to vibrations.

To also assure the retainer's 3 position, a lock screw 7 will be placed over the retainer 3, preventing the vertical movement of said element and thus assuring the box 5 position on the support 4.

What is claimed is:

1. A distribution box having a front end and a rear end and adapted for housing a vehicle electronic distribution system and capable of being temporarily fixed to a support having a through hole at a first end thereof, comprising:

a fixing device positioned at the front end of the distribution box which includes a U-shaped pin connected at one end to the front end of the distribution box with a second end being free, wherein the U-shaped pin has a projection extending below a lower surface of the distribution box and is adapted to be inserted into the hole in the support upon assembly of the distribution box on the support, and wherein the projection includes a contoured exterior adapted to engage the periphery of the hole upon insertion of the U-shaped pin in the hole and prevent removal of the U-shaped pin from the hole.

2. A distribution box according to claim 1, wherein the fixing device includes a movable retainer initially positioned above the U-shaped pin and adapted to move downward, upon insertion of the U-shaped pin into the hole, from the initial position to a position within the U-shaped pin to secure the U-shaped pin within the hole and secure the distribution box on the support.

3. A distribution box according to claim 1, wherein the distribution box has butt elements extending from a lower part of the distribution box which make contact with an upper surface of the support upon insertion of the U-shaped pin into the hole which is shaped as a bell-mouthed hole.

4. A distribution box according to claim 1, wherein the support for the distribution box forms part of a vehicle body and has bell-mouthed holes for receiving pivots arranged on a lower part of the rear end of the distribution box.

5. An improved distribution box fixing device according to claim 1, wherein the support for the distribution box is an addition to a vehicle body and includes vertical alignment holes to receive pivots on the rear end of the distribution box which upon assembly enables movement of the distribution box on the support as well as provides a centering of the distribution box on the support.

* * * * *